United States Patent [19]

Ren et al.

[11] Patent Number: 4,943,540
[45] Date of Patent: Jul. 24, 1990

[54] METHOD FOR SELECTIVELY WET ETCHING ALUMINUM GALLIUM ARSENIDE

[75] Inventors: Fan Ren, Dunellen Township, Middlesex County; Nitin J. Shah, Scotch Plains, both of N.J.

[73] Assignee: AT&T Bell Laboratories, Murray Hill, N.J.

[21] Appl. No.: 290,774

[22] Filed: Dec. 28, 1988

[51] Int. Cl.$^5$ .................... H01L 21/00; H01L 21/02; H01L 21/208; H01L 29/68
[52] U.S. Cl. .................... 437/225; 437/228; 437/229; 148/DIG. 15; 148/DIG. 56; 156/625; 156/654; 156/655; 372/50; 357/16; 357/17
[58] Field of Search .................... 437/225, 228; 148/DIG. 51, DIG. 56; 156/625, 633, 662, 654, 655

[56] References Cited

U.S. PATENT DOCUMENTS 3,959,045  5/1976  Antypas .................... 437/92
4,162,337  7/1979  D'Asaro et al. .................... 437/902

FOREIGN PATENT DOCUMENTS 0160663  8/1985  Japan .

OTHER PUBLICATIONS

Wu, X., Select. Etch. Charact. of HF for $Al_xGa_{1-x}As$, Elect. Letters, vol. 21, pp. 558–559, 1985.
Kenefick, K., Select. Etch. Charact. of Peroxide/Ammonium-Hydroxide Solns for $GaAs/Al_{0.16}Ga_{0.84}As$, J. Electrochem. Soc.: Solid State Sci. and Tech., vol. 129, No. 10, Oct. 1982, pp. 2380–2382.
Ghandhi, S., VLSI Fabrication Principles, pp. 542 and 546, Wiley & Sons, 1983.
Colclaser, R., Microelectronics: Processing and Device Design, p. 39, Wiley & Sons, 1980.

Primary Examiner—Brian E. Hearn
Assistant Examiner—B. Everhart
Attorney, Agent, or Firm—Scott W. McLellan

[57] ABSTRACT

A method for selectively etching higher aluminum concentration AlGaAs in the presence of lower aluminum concentration AlGaAs or GaAs, preferably at room temperature. The AlGaAs is first cleaned with a solution of $NH_4OH$ and rinsed. The AlGaAs is then etched in a solution of HF. If photoresist is used on the AlGaAs, the photoresist may first be baked to increase the adhesion of the photoresist to the AlGaAs and to "toughen" the photoresist to reduce undercutting thereof. Agitation is applied to the AlGaAs or the etchant to assist in the uniform etching of the AlGaAs.

14 Claims, 2 Drawing Sheets

METHOD FOR SELECTIVELY WET ETCHING ALUMINUM GALLIUM ARSENIDE

This invention was made with Govenment support under contract No. F29601-82-R-0202 awarded by the Defense Advanced Research Projects Agency, and contract No. F33615-84-C-1570 awarded by the Air Force Wright Aeronautical Laboratories. The Government has certain rights in this invention.

RELATED APPLICATIONS

This application is filed simultaneously with an application titled "Fabrication of GaAs Integrated Circuits" by R. E. Ahrens, et al. and assigned to the same assignee as this invention.

1. FIELD OF THE INVENTION

This invention relates generally to the manufacture of semiconductor devices, and more particularly, to the selective etching of aluminum gallium arsenide in preference to gallium arsenide in such manufacture.

BACKGROUND OF THE INVENTION

Optical devices (e.g., light emitting diodes and semiconductor lasers) and high performance semiconductor devices (e.g., heterojunction field-effect transistors and heterojunction bipolar transistors) have therein semiconductor material with different bandgap energies. The different bandgap energies, and associated refractive index differences, provide the desired quantum mechanical features and functions in the devices, such as potential wells, tunneling and waveguiding. Compound semiconductors, such as gallium arsenide (GaAs), provide the desired different bandgap energies and are easily deposited in precisely controlled layers. For example, by substituting aluminum for gallium in gallium arsenide (forming aluminum gallium arsenide or AlGaAs), the bandgap energy can be increased. Generally, the more the aluminum added, the larger the bandgap energy. The GaAs/AlGaAs materials can be deposited in layers using solid source molecular beam epitaxy (MBE), metal-organic MBE, gas source MBE or metal-organic chemical vapor deposition (MOCVD). These two techniques allow for almost atom-by-atom growth of the compound semiconductor crystal.

To form the optical devices and high performance semiconductor devices out of the layers of compound semiconductor material, it is frequently necessary to selectively etch adjacent layers of material which differ only in their bandgap energies. For GaAs/AlGaAs, commonly used etchants etch the GaAs and AlGaAs at rates depending on the amount of aluminum in the AlGaAs. For example, K. Kenefick in "Selective Etching Characteristics of Peroxide/Ammonium-Hydroxide Solutions for GaAs/Al$_{0.16}$Ga$_{0.84}$As", *Journal of the Electrochemical Society*, Vol. 129, No. 10, pp. 2380-2382, discloses a hydrogen peroxide (H$_2$O$_2$)/ammonium hydroxide (NH$_4$OH) etchant with a selectivity of etching Al$_{0.16}$Ga$_{0.84}$As over GaAs of 10 to 30 depending on the pH of the H$_2$O$_2$/NH$_4$OH solution. Another etchant is described by X. S. Wu et al. in "Selective Etching Characteristics of HF for Al$_x$Ga$_{1-x}$As/GaAs", in *Electron Letters*, Vol. 21, pp 558-559. Here, hydrofluoric acid (HF) is used to etch AlGaAs at relatively high temperatures (80° C.) using a gold mask to protect the underlying AlGaAs where no etching is desired.

SUMMARY OF THE INVENTION

A primary feature of the invention is to provide an AlGaAs etchant which etches a higher aluminum concentration AlGaAs in preference to a lower aluminum concentration AlGaAs or GaAs. The etchant functions at a relatively low temperature (preferably room temperature) so that conventional photoresists can be used to allow selective etching of the AlGaAs.

This feature and other features are generally provided for in one embodiment of a method for selectively etching AlGaAs on a wafer characterized by the steps of: depositing a masking layer over the AlGaAs; patterning the masking layer to expose regions of the AlGaAs to be etched; cleansing the exposed AlGaAs regions with ammonium hydroxide; and etching the AlGaAs regions with diluted hydrofluoric acid at a temperature not greater than the boiling temperature of the diluted hydrofluoric acid.

Another embodiment which generally provides for the above and other features is a method for selectively etching AlGaAs on a wafer characterized by the steps of: depositing photoresist over the AlGaAs; patterning the photoresist to expose regions of the AlGaAs to be etched; baking the photoresist; etching the AlGaAs regions with a solution of diluted hydrofluoric acid at a temperature not greater than the boiling temperature of the diluted hydrofluoric acid; wherein the baking of the photoresist increases the adhesion of the photoresist to the AlGaAs layer.

BRIEF DESCRIPTION OF THE DRAWING

The foregoing features of this invention, as well as the invention itself, may be more fully understood from the following detailed description of the drawings, in which.

Figure 3:
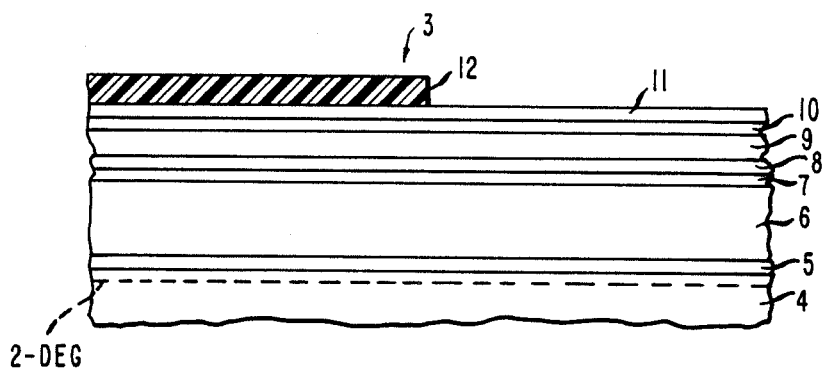
FIG. 3 is a cross-sectional view of a wafer with multiple layers of AlGaAs and GaAs.
Figure 4:
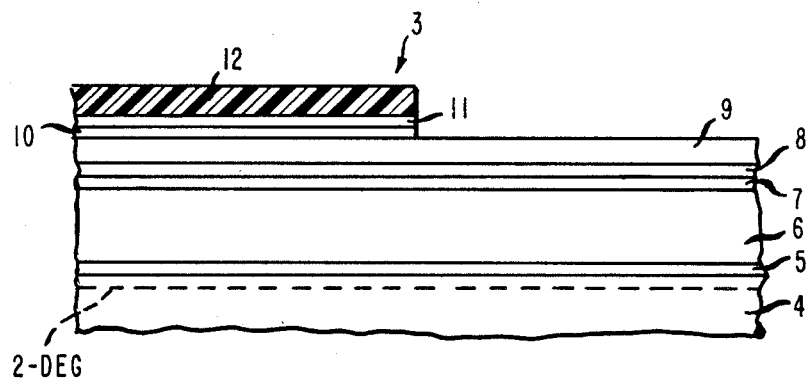
FIG. 4 is the wafer of FIG. 3 after selectively etching the wafer.
Figure 5:
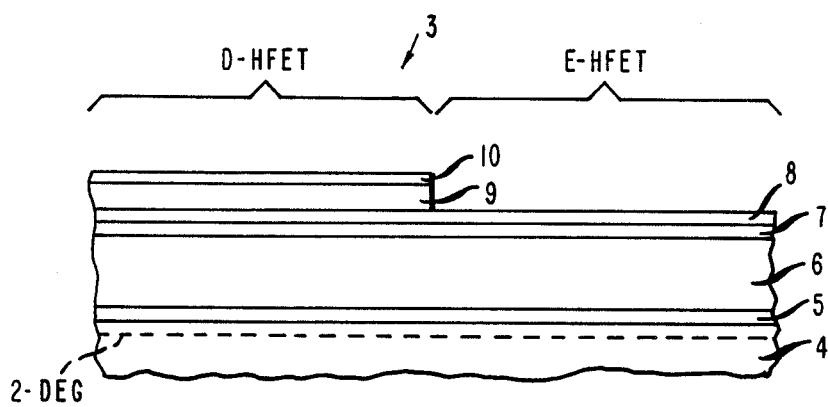
FIG. 5 is the wafer of FIG. 4 after a final etch.

It is noted that FIGS. 3, 4 and 5 are not to scale.

DETAILED DESCRIPTION

The molar concentration of aluminum in aluminum gallium arsenide (AlGaAs) is usually identified as x in Al$_x$Ga$_{1-x}$As, where x can range from 0 (0%, or no aluminum) to 1 (100% aluminum, or no gallium), depending on the bandgap energy required of the AlGaAs material. Generally, the more the aluminum, the larger the bandgap energy of the AlGaAs material. For purposes here, gallium arsenide will be identified as GaAs and aluminum gallium arsenide will be identified as AlGaAs. The concentration of aluminum in AlGaAs will be designated by the percentage of aluminum therein.

In the method for selectively etching a layer of higher aluminum concentration AlGaAs in the presence of a layer of lower aluminum concentration AlGaAs or GaAs, it is preferable that the etching substantially stop when the layer of higher aluminum concentration Al- GaAs is completely etched away, i.e., the etchant should not be effective in etching the lower aluminum concentration AlGaAs, or GaAs, to any significant extent when compared to the etching of the higher aluminum concentration AlGaAs. Any etchant of AlGaAs is likely to have poor selectivity when the AlGaAs with the highest concentration of aluminum is low, e.g., less than 20%. It is also considered desirable that the etching should not require elevated etchant solution temperatures, making for easier, safer handling by human operators and reduced corrosion of equipment by the vaporization of the etchant. A solution of hydrofluoric acid (HF) in water has been found to be effective in etching AlGaAs at room temperature if the concentration of aluminum is 30% or greater. Further, HF can be diluted to control the etch rate of the AlGaAs having high concentrations of aluminum, e.g., 50% to 60% aluminum. However, it is understood that the HF solution can be used for etching AlGaAs at temperatures up to the boiling point of the HF solution, e.g. greater than 100° C. A further advantage to room temperature HF etchant is the reduced etching rate of low aluminum concentration AlGaAs or GaAs, making the HF etchant more selective of high aluminum concentration AlGaAs in the presence of low aluminum concentration AlGaAs or GaAs, as will be explained below.

In most cases, the etching of AlGaAs occurs in the presence of GaAs. Hence, for purposes here, discussion of the method for etching AlGaAs will center on etching AlGaAs in the presence of GaAs without loss of generality. In particular, the disclosed method of etching is applicable to the etching of higher aluminum concentration AlGaAs in the presence of lower aluminum concentration AlGaAs.

Figure 1:
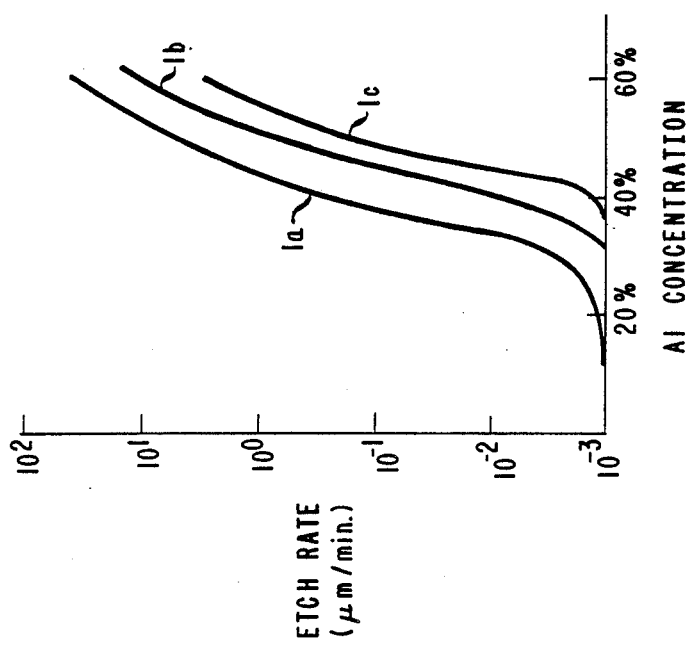
FIG. 1 is a plot of the etch rate of three different HF etchant concentrations in water verses the aluminum concentration in AlGaAs.

Referring to FIG. 1, a plot of the approximate etch rate (micrometers per minute) of AlGaAs at approximately room temperature (20° C.) is shown for three different concentrations of HF (diluted in water) against the concentration of aluminum in the AlGaAs. Curve 1a represents the etch rate with a concentration of approximately 48% HF in water. Curve 1b represents the etch rate with a concentration of approximately 24% HF in water. Curve 1c represents the etch rate with a concentration of approximately 9.6% HF in water. All of the HF solutions are analytical reagent (AR) grade or equivalent. As shown in FIG. 1, the etch rate is very fast for all concentrations of HF when the concentration of aluminum is 50% or greater. Conversely, the etch rate is very slow for all concentrations of HF when the concentration of aluminum is less than 20%. The measured each rate at about 20° C. for GaAs (no aluminum) is about 5 nanometers per minute for 48% HF and less than 5 nanometers per minute for the more dilute HF concentrations.

Figure 2:
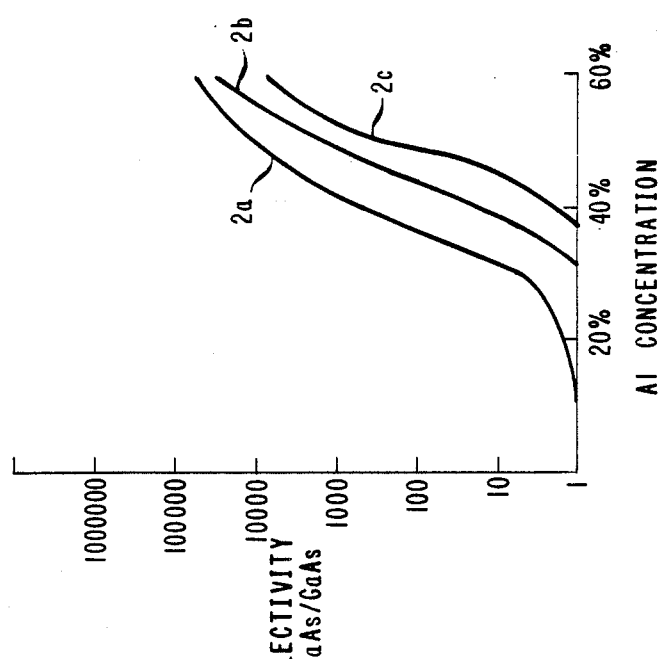
FIG. 2 is a plot of the etching selectively for AlGaAs versus GaAs of the three different HF etchant concentrations in water verses aluminum concentration in the AlGaAs.

Using the ratio of the etch rate of AlGaAs divided by the etch rate of GaAs for each of the different concentrations of HF, the approximate selectivity of the etchants can be plotted. This is shown in FIG. 2. Curve 2a, corresponding to curve 1a in FIG. 1, represents the etch selectivity with an HF concentration of approximately 48% in water. Curve 2b, corresponding to the curve 1b in FIG. 1, represents the etch electivity with an HF concentration of approximately 24%. Curve 2c, corresponding to the curve 1c in FIG. 1, represents the etch selectivity with an HF concentration of approximately 9.6%. As stated above, all HF solutions are AR grade or equivalent. As shown in FIG. 1, the etch rate for AlGaAs with an aluminum concentration of 50% ranges from approximately 0.1 micrometer per minute for 9.6% HF to approximately 10 micrometers per minute for 48% HF. With the GaAs etch rates discussed above, these AlGaAs etch rates have corresponding selectivities of approximately 350 to 10,000.

To achieve uniform etching of the AlGaAs with the high etch rates and selectivities discussed above, the AlGaAs surface should be as clean as possible. It has been discovered that cleaning the AlGaAs surface with a solution of ammonium hydroxide ($NH_4OH$ diluted to 1:1 or less in water) results in the removal of oxides and other contaminants from the surface of the AlGaAs. The AlGaAs is preferably cleaned by dipping the AlGaAs in an approximately 20% solution of $NH_4OH$ in water for 30 seconds and then rinsed with pure water. The cleaning of the AlGaAs in this manner prior to the HF etch results in a substantially uniform and precise etch thereof.

The method for selectively etching AlGaAs can be used in conjunction with a photoresist to protect portions of the AlGaAs where no etching is desired. However, with strong concentrations of HF, e.g. greater than 15% HF in water, severe undercutting of the photoresist by the etchant can occur. This is especially true with high etchant temperatures, such as near 80° C. It has been discovered that to control the undercutting, the photoresist is baked in an oven at approximately 110° C. for 15 minutes in an non-reactive atmosphere, such as dry Nitrogen, after the photoresist is patterned. This increases the adhesion of the photoresist to the AlGaAs and "toughens" the photoresist by cross-linking the polymer chains in the photoresist. The photoresist and AlGaAs layer is then cleaned and etched as described above.

It has been discovered that the etching of the AlGaAs is diffusion-limited instead of reaction-rate-limited; i.e., the etching of the AlGaAs is limited not by how fast the etchant can react with the AlGaAs but by how fast the etchant is transported to the etchant/AlGaAs interface for reaction with the AlGaAs. Measured activation energies for the etching of AlGaAs with 50% aluminum therein is about 7 kilocalories per mole and for AlGaAs with 60% aluminum therein is about 6 kilocalories per mole, indicating a diffusion-limited reaction. In addition, it has been found that the etching of the AlGaAs is not uniform across a wafer with AlGaAs thereon without agitation, a further indication of diffusion-limited etching. Hence, it is desirable to agitate the HF etching solution or the wafer to ensure uniform etching of the AlGaAs.

EXAMPLE

An example of the use of the above described etchant is given below. This example is part of a fabrication process for FETs described in the above-identified co-filed patent application of R. E. Ahrens, et al.

In FIG. 3, a partial cross-sectional view of a wafer 3 (not to scale) is shown ready for the manufacturing of both enhancement and depletion type of selectively doped heterojunction field-effect transistors (hereinafter referred to as E-HFET and D-HFET, respectively).

Although not described in detail here, layers 4 through 11 are grown on a semi-insulating GaAs substrate 2 (not shown) in a molecular beam epitaxy (MBE) machine, forming an essentially continuous layer from a substrate (not shown). However, it is possible to grow such layers 4–11 by metal-organic chemical vapor deposition (MOCVD) metal-organic MBE and gas source MBE. The layers 4-11 are described in more detail in the above-identified patent application, but, for purposes here, the function and composition of the layers will be summarized. A buffer layer 4 of undoped GaAs supports a channel of a two-dimensional electron gas (2-DEG) which is the active region of later formed E-HFETs and D-HFETs. It is in this channel that current flows between the drain and source electrodes of corresponding E-HFETs and D-HFETs. Over the buffer layer 4 is a first spacer layer 5, then a donor layer 6 and then a second spacer layer 7. All layers 5, 6 and 7 are of AlGaAs but with layer 6 doped with an exemplary Silicon dopant to produce an n-type layer 6. Layer 6 is used to produce the 2-DEG described above. Next a first cap layer 8 of GaAs forms the major surface on which E-HFETs are formed, as will be explained in more detail below. A second cap layer 10 of GaAs over an etch-stop layer 9 of AlGaAs, forms the major surface on which D-HFETs are formed, as will be explained in more detail below. The purpose of the etch-stop layer 9 will be explained in more detail below, but for purposes here, the layer 9 assists in the precise selective etching of the wafer 3 where the major surface of the first cap layer is to be expoxed. Lastly, a protective layer 11 of AlGaAs, a sacrificial layer, protects the entire wafer 3 during subsequent processing from contaminants and damage. The concentration of aluminum in layers 11 and 9 is approximately 50%.

In FIG. 3, the wafer 3 has deposited thereon a layer of photoresist 12 patterned to expose the protective layer 11 where an E-HFET is to be formed. An exemplary resist is a Shipley AZ-1350J. After the resist 12 is patterned, the entire wafer 3 is optionally baked, as described above, to increase the adhesion of the resist 12 to the protective layer 11 and "toughen" the resist 12, reducing undercutting of the resist during the etch.

The wafer 3 is then cleaned in the approximately 20% NH4OH solution discussed above. The cleaning solution is then washed off the wafer 3 with water and the wafer 3 is then etched with diluted HF at approximately 20° C., discussed above. Preferably, the HF etchant is approximately 24% HF diluted in water. The HF etch removes the protective layer 11 where the photoresist 12 (FIG. 3) is not present. This leaves selected portions of the second cap layer 10 (not shown) exposed and the wafer 3 is thoroughly cleaned. The wafer 3 is then etched in a conventional GaAs wet etch of Potassium Iodide/Iodine (KI/I2) solution until all of the second cap layer 10 (GaAs) is removed, exposing selected areas of the etch-stop layer 9, leaving wafer 3 substantially as shown in FIG. 4. Since the KI/I2 etch is not very selective, the layer 10 is actually over-etched, ensuring that all of the second cap layer 10 is removed from etch-stop layer 9 where desired. Complete removal is not critical since, as described above, the etch-stop layer 9 is not part of the later-formed E-HFETs.

The photoresist is then removed and the wafer 3 is again thoroughly cleaned in the approximately 20% NH4OH solution. The wafer 3 is then again etched in the HF etchant at approximately 20° C., etching simultaneously the etch-stop layer 9 and the protective layer 11, until all of the exposed etch-stop layer 9 is removed and all of the remaining protective layer 11 is removed. The result is substantially as shown in FIG. 5. Gate, source and drain contacts (not shown) of later-formed E-HFETs and D-HFETs are formed on the layers 8 and 10, respectively. Since the electrical characteristics of the later-formed E-HFETs and D-HFETs are determined by the thicknesses of the layers 5-8 and 5-10, respectively, any over-etching of the layers 8 and 10 would have a very significant detrimental impact on the desired electrical characteristics. Hence, the AlGaAs etchant must be very selective.

Having described the preferred embodiment of this invention, it will now be apparent to one of skill in the art that other embodiments incorporating its concept may be used. Therefore, that this invention should not be limited to the disclosed embodiment, but rather should be limited only by the spirit and scope of the appended claims.

What is claimed is:

1. A method of manufacturing a semiconductor device, which includes etching AlGaAs on an wafer, CHARACTERIZED BY THE STEPS OF:

depositing a masking layer over the AlGaAs;
   patterning the masking layer to expose regions of the AlGaAs to be etched;
   cleaning the exposed AlGaAs regions with a solution of ammonium hydroxide (NH4OH);
   etching the AlGaAs regions with a solution of diluted hydrofluoric acid (HF) at a predetermined temperature or less;
   wherein the predetermined temperature is approximately the boiling temperature of the diluted HF solution, the concentration of HF 48% or less, and the concentration of aluminum in the AlGaAs is 60% or less.

2. The method for selectively etching AlGaAs recited in claim 1, wherein the masking layer is photoresist, and FURTHER CHARACTERIZED BY THE STEP OF:

baking the photoresist prior to the etching step;
   wherein the baking of the photoresist increases the adhesion of the photoresist to the AlGaAs layer.

3. The method for selectively etching AlGaAs recited in claim 2, wherein the photoresist is baked in a non-reactive atmosphere.

4. The method for selectively etching AlGaAs recited in claim 3, wherein the non-reactive atmosphere is N2 and the baking occurs at a temperature of approximately 110° C. for approximately 30 minutes.

5. The method for selectively etching AlGaAs recited in claim 1, wherein the predetermined temperature is less than 80° C.

6. The method for selectively etching AlGaAs recited in claim 5, wherein the predetermined temperature is substantially room temperature.

7. The method for selectively etching AlGaAs recited in claim 1, wherein the NH4OH is diluted in water at a concentration of 1:1 or less.

8. The method for selectively etching AlGaAs as recited in claim 1, FURTHER COMPRISES THE STEP OF:

agitating the wafer or the diluted HF etchant.

9. A method of manufacturing a semiconductor device, which includes etching AlGaAs on a wafer, CHARACTERIZED BY THE STEPS OF:

depositing photoresist over the AlGaAs;
   patterning the photoresist to expose the AlGaAs where the AlGaAs is to be etched;
   baking the photoresist;
   cleaning the exposed AlGaAs with a solution of ammonium hydroxide (NH4OH) diluted with water at a concentration of 1:1 or less;

etching the AlGaAs with a solution of diluted hydrofluoric acid (HF) at a predetermined temperature or less;
wherein the predetermined temperature is approximately the boiling temperature of the diluted HF solution and the baking of the photoresist increases the adhesion of the photoresist to the AlGaAs layer.

10. The method for selectively etching AlGaAs recited in claim 9, wherein the photoresist is baked in a non-reactive atmosphere.

11. The method for selectively etching AlGaAs recited in claim 10, wherein the non-reactive atmosphere is $N_2$ and the baking occurs at a temperature of approximately 110° C. for approximately 30 minutes.

12. The method for selectively etching AlGaAs recited in claim 9, wherein the predetermined temperature is less than 80° C.

13. The method for selectively etching AlGaAs recited in claim 12, wherein the predetermined temperature is substantially room temperature.

14. The method for selectively etching AlGaAs recited in claim 9, FURTHER CHARACTERIZED BY THE STEP OF:
agitating the wafer or the diluted HF etchant.

* * * * *